(12) United States Patent
Bull et al.

(10) Patent No.: US 8,103,922 B2
(45) Date of Patent: Jan. 24, 2012

(54) ERROR DETECTION IN PRECHARGED LOGIC

(75) Inventors: David Michael Bull, Balsham (GB); Shidhartha Das, Cambridge (GB); David Theodore Blaauw, Ann Arbor, MI (US)

(73) Assignees: ARM Limited, Cambridge (GB); The Regents of the University of Michigan, Ann Harbor, MI (US)

( * ) Notice: Subject to any disclaimer, the term of this patent is extended or adjusted under 35 U.S.C. 154(b) by 0 days.

(21) Appl. No.: 13/162,308

(22) Filed: Jun. 16, 2011

(65) Prior Publication Data

US 2011/0246843 A1 Oct. 6, 2011

Related U.S. Application Data

(62) Division of application No. 12/382,427, filed on Mar. 16, 2009, now Pat. No. 8,006,147.

(51) Int. Cl.
*G11C 29/00* (2006.01)
(52) U.S. Cl. ..................................................... 714/721
(58) Field of Classification Search .................. 714/721, 714/724
See application file for complete search history.

(56) References Cited

U.S. PATENT DOCUMENTS

| | | | | |
|---|---|---|---|---|
| 4,229,759 A * | 10/1980 | Harwood et al. | ............. | 348/505 |
| 5,185,744 A * | 2/1993 | Arimoto et al. | ............... | 714/719 |
| 5,500,688 A | 3/1996 | Mok | | |
| 6,844,762 B2 | 1/2005 | Sanchez | | |
| 7,053,663 B2 | 5/2006 | Hazucha et al. | | |
| 7,408,795 B2 * | 8/2008 | Vinciarelli | .................... | 363/125 |
| 7,546,519 B2 | 6/2009 | Agarwal | | |
| 7,705,647 B2 * | 4/2010 | Dai et al. | ....................... | 327/175 |
| 7,705,649 B1 | 4/2010 | Yu et al. | | |
| 2010/0244918 A1 | 9/2010 | Moyer et al. | | |
| 2010/0269018 A1 | 10/2010 | Clark et al. | | |

OTHER PUBLICATIONS

U.S. Appl. No. 12/382,427, filed Mar. 16, 2009, Inventor: Bull et al.
Office Action mailed Jan. 10, 2011 in co-pending U.S. Appl. No. 12/382,427.

* cited by examiner

*Primary Examiner* — James C Kerveros
(74) *Attorney, Agent, or Firm* — Nixon & Vanderhye P.C.

(57) ABSTRACT

An integrated circuit is provided with domino logic including a speculative node and a checker node. Precharged circuitry precharges both the speculative node and the checker node. Logic circuitry provides a discharge path for the speculative node and the checker node in dependence upon input signal values. Evaluation control circuitry first couples the speculative node to the logic circuitry and then subsequently couples the checker node to the logic circuitry such that these can be discharged if the input signals to the logic circuitry have appropriate values. Error detection circuitry detects an error when the speculative node and the checker node are not one of both discharged or both undischarged.

9 Claims, 9 Drawing Sheets

ERROR DETECTION IN PRECHARGED LOGIC

This application is a divisional of U.S. application Ser. No. 12/382,427, filed on Mar. 16, 2009, now U.S. Pat. No. 8,006,147, the entire contents of which are hereby incorporated by reference.

INTRODUCTION

This technology described in this application relates to the field of precharged logic, such as, for example, domino logic, and more particularly to error detection within such precharged logic.

BACKGROUND

It is known to provide domino logic in which precharged nodes are discharged in response to combinations of input signals. These nodes generate signals which go onto control the discharge of other nodes. Domino logic has become less widely used in recent times due to a variety of factors including the rapid advance in process technology coupled with continuous improvements in design automation that are better suited to logic designs different to domino logic designs. While domino logic is inherently well suited to high speed operation, this advantage has been reduced compared to standard CMOS logic. However, it is primarily the fundamental design complexity and the necessary compromises between robustness and speed which makes the use of domino logic difficult in small process geometries. In particular, noise, charge-sharing, leakage and variability, all of which tend to become greater in significance at smaller process geometries, combine to make the practical use of domino logic in small process geometries difficult. In particular, errors can arise through sources such as late (rising) signals, noise triggering incorrect discharge of domino nodes, inappropriately selected or controlled keeper strength and/or incorrectly controlled or adjusted precharge settings.

SUMMARY

Viewed from one aspect, an integrated circuit having at least one processing stage comprises a speculative node; a checker node; precharge circuitry coupled to said speculative node and to said checker node to precharge said speculative node and to precharge said checker node; logic circuitry responsive to one or more input signals to provide a discharge path in dependence upon values of said one or more input signals; evaluation control circuitry responsive to at least one evaluation control signal to couple said speculative node to said logic circuitry to be discharged through said discharge path in dependence upon said one or more input signals and subsequently to couple said checker node to said logic circuitry to be discharged through said discharge path in dependence upon said one or more input signals; and error detection circuitry coupled to said speculative node and to said checker node to detect an error when any one of: (i) said speculative nodes is discharged and said checking node is undischarged; (ii) said speculative node is undischarged and said checking node is discharge; and (iii) said speculative node is partially discharged.

The present technique provides an integrated circuit including precharged logic, such as domino logic, with built-in error detection circuitry. The error detection circuitry is able to detect late discharge and partial discharge. A variety of different responses and/or strategies may be used when an error is detected.

Whilst it will be appreciated that the above technique is suited for a variety of different forms for precharged logic, it is particularly suited for use in integrated circuits which include a plurality of processing stages formed in this way which together provide a domino logic circuit.

Within such domino logic circuits, a signal value of a speculative node of a first processing stage of the domino logic circuit is supplied as an input signal to logic circuitry of a second processing stage of the domino logic circuit.

The evaluation control signal or signals may take a variety of different forms. In some embodiments, the evaluation control signals comprise a speculative clock signal controlling coupling of the speculative node to the logic circuitry and a checker clock signal controlling coupling of the checker node to the logic circuitry. The provision of multiple clocks with a predetermined relationship between those clocks may be relatively conveniently provided and is well understood from a design and validation perspective.

In some embodiments a transition in the speculative clock signal to a speculative clock signal value that decouples the speculative node from the logic circuitry may also serve to trigger a transition in the checker clock signal to a checker clock signal value that couples the checker node to the logic circuitry. In this way, the relative phase of the speculative clock signal and the checker clock signal may be ensured.

In other embodiments, the transition in the checker clock signal to a checker clock signal value that decouples the checker node from the logic circuitry may be self-timed.

In further embodiments, the speculative clock signal and the checker clock signal may be part of a four-phase clocking scheme. Such a four-phase clocking scheme provides a convenient way for controlling the action of the checker node in relation to the action of the speculative node.

The error detection circuitry provided by the present technique is able to responds to a variety of different types of error. When the error detection circuitry detects that the speculative node is undischarged and the checker node is discharged, this is indicative of an error due to a late change in one or more of the input signals to the logic circuitry.

When the error detection circuitry detects that the speculative node is discharged and the checker node is undischarged, this is indicative of an error due to noise inducing and incorrect discharge of the speculative node.

The detection of metastability by the error detection circuitry is indicative of either late discharge or partial discharge of the speculative node.

Whilst it is possible that the error detection circuitry may be used to flag the occurrence of an error, it is also possible to provide a form of closed-loop control in which the operation of the processing stage is adjusted in response to detection of an error by the error detection circuitry.

In some embodiments detection of an error by the error detection circuitry increases the magnitude of precharge, by either increasing the precharge voltage, or increasing the effective capacitance of the speculative node. Increasing the precharge may slow operation and increase energy consumption, but it will tend to make operation more robust.

Additionally or alternatively, keeper circuitry coupled to the speculative node and configured to maintain the speculative node in its precharged state until overwhelmed by discharge through the discharge path may be controlled in response to detection of an error so as to increase the conductance of the keeper circuitry and thus more strongly maintain the speculative node in the precharged state. Such control of the keeper circuitry can make the operation more robust to errors, but will tend to slow down operation.

The above closed-loop control techniques are useful in that the parameters in operation may be adjusted to suit the individual circuit and its current operating parameter/environment in a way that produces reliable and robust operation without wasteful excessive margining.

The evaluation control circuitry can take a variety of different forms. A simple form comprises a speculative node evaluation gate responsive to the speculative clock signal to selectively couple the speculative node to the logic circuitry. In a similar way, a checker node evaluate gate responsive to the checker clock signal may be used to selectively couple the checker node to the logic circuitry.

Viewed from another aspect an integrated circuit having at least one processing stage comprises speculative node means; checker node means; precharge means coupled to said speculative node means and to said checker node means for precharging said speculative node means and for precharging said checker node means; logic means responsive to one or more input signals for providing a discharge path in dependence upon values of said one or more input signals; evaluation control means responsive to at least one evaluation control signal for coupling said speculative node means to said logic means to be discharged through said discharge path in dependence upon said one or more input signals and subsequently for coupling said checker node means to said logic means to be discharged through said discharge path in dependence upon said one or more input signals; and error detection means coupled to said speculative node means and to said checker node means detecting an error when any one of: (i) said speculative nodes is discharged and said checking node is undischarged; (ii) said speculative node is undischarged and said checking node is discharge; and (iii) said speculative node is partially discharged.

Viewed from a further aspect, a method of operating an integrated circuit comprises the steps of: precharging a speculative node; precharging a checker node; providing a discharge path in dependence upon values of said one or more input signals; in response to at least one evaluation control signal, coupling said speculative node to be discharged to said discharge path in dependence upon said one or more input signals and subsequently coupling said checker node to be discharged to said discharge path in dependence upon said one or more input signals; and detecting an error when any one of: (i) said speculative nodes is discharged and said checking node is undischarged; (ii) said speculative node is undischarged and said checking node is discharge; and (iii) said speculative node is partially discharged.

A complementary aspect provides an integrated circuit having at least one processing stage comprising: a speculative node; an output node; precharge circuitry coupled to said speculative node to precharge said speculative node; logic circuitry responsive to one or more input signals to provide a first discharge path in dependence upon values of said one or more input signals; complementary logic circuitry responsive to one or more complement input signals, said one or more complement input signals being complements of said one or more input signals, to provide a second discharge path in dependence upon said one or more complement input signals, such that combinations of said one or more input signals that provide said first discharge path do not provide said second discharge path and combinations of said one or more input signals that do not provide said first discharge path do provide said second discharge path; evaluation control circuitry responsive to at least one evaluation control signal to couple said speculative node to said logic circuitry to be discharged through said first discharge path in dependence upon said one or more input signals; an inverting circuit coupled to said speculative node and configured to charge said output node if said speculative node is discharged; wherein subsequent to coupling of said speculative node to said logic circuit, said evaluation circuit couples said output node to said complementary logic circuitry to be discharged through said second discharge path in dependence upon said one or more complementary input signals; and error detection circuitry coupled to said output node to detect an error when said output node is discharged through said complementary logic circuitry.

In this aspect the error detection is provided by the use of complementary logic circuitry responsive to one or more complement input signals derived from the input signals from the main logic circuitry. The complement logic circuitry during normal operation will not discharge the output node if the speculative node has been properly discharged, but if the speculative node was discharged incorrectly, such as due to noise, then the output node will be charged in response to the discharge of the speculative node and the complementary logic circuitry will then discharge the output node in the subsequent evaluation performed by the complementary logic circuitry. This discharge through the complementary logic circuitry is indicative of an error. The inverting circuit may be a simple inverter or some other circuit which provides the function of inverting (as well as any other functions which might be combined therewith).

This technique is suited to use in domino logic circuits and may similarly be used to provide closed-loop control as previously discussed. The use of a processing stage with both logic circuitry and complementary logic circuitry as discussed above may be combined with use of a further processing stage including a further speculative node and a checker node as also mentioned above. It may be that different forms of error detection in accordance with the present techniques are better suited to particular processing stages and may be targeted accordingly.

Viewed from a further aspect, an integrated circuit having at least one processing stage comprises speculative node means; output node means; precharge means coupled to said speculative node for precharging said speculative node means; logic means responsive to one or more input signals for providing a first discharge path in dependence upon values of said one or more input signals; complementary logic means responsive to one or more complement input signals that are complements of said one or more input signals for providing a second discharge path in dependence upon said one or more complement input signals, such that combinations of said one or more input signal that provide said first discharge path do not provide said second discharge path and combinations of said one or more input signals that do not provide said first discharge path do provide said second discharge path; evaluation control means responsive to at least one evaluation control signal for coupling said speculative node means to said logic means to be discharged through said discharge path in dependence upon said one or more input signals; an inverting circuit coupled to said speculative node means and configured to charge said output node if said speculative node means is discharged; wherein subsequent to coupling of said speculative node means to said logic means, said evaluation means couples said output node means to said complementary logic means to be discharged through said discharge path in dependence upon said one or more input signals; and error detection means coupled to said output node to detect an error when said output node means is discharged through said complementary logic means.

Viewed from a further aspect, a method of operating an integrated circuit comprises the steps of: precharging a speculative node; providing a first discharge path in dependence upon values of one or more input signals; providing a second discharge path in dependence upon one or more complement input signals, said one or more complement input signals being complements of said one or more input signals, such that combinations of said one or more input signals that provide said first discharge path do not provide said second discharge path and combinations of said one or more input signals that do not provide said first discharge path do provide said second discharge path; in response to at least one evaluation control signal, coupling said speculative node to be discharged to said first discharge path in dependence upon said one or more input signals; charging an output node if said speculative node is discharged; subsequent to said coupling of said speculative node, coupling said output node to be discharged to said second discharge path in dependence upon said one or more complementary input signals; and detecting an error when said output node is discharged through said second discharge path.

DESCRIPTION OF NON-LIMITING EXAMPLE EMBODIMENTS

Figure 1:
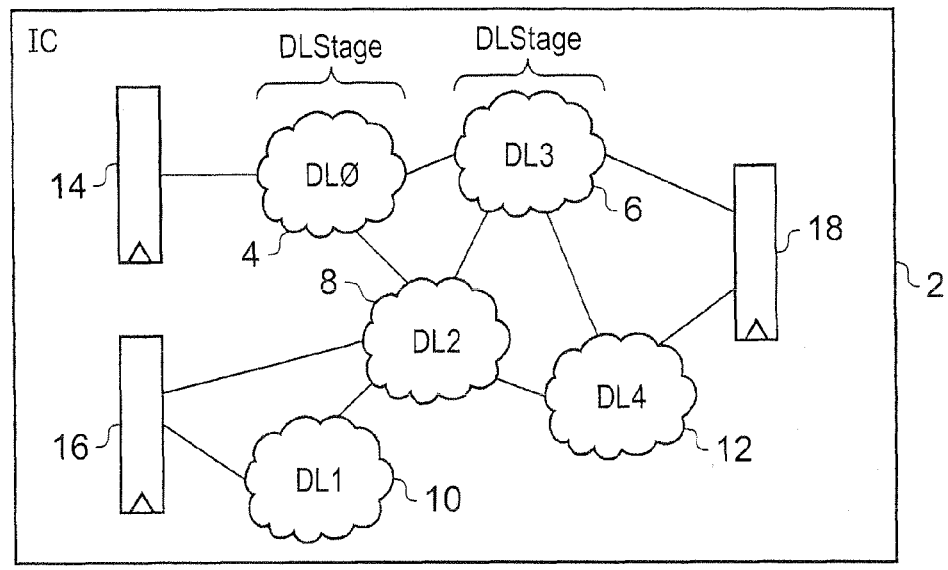
FIG. 1 schematically illustrates an integrated circuit including a plurality of processing stages utilising domino logic.

FIG. 1 illustrates an integrated circuit 2 including multiple processing stages 4, 6, 8, 10, 12 disposed between input registers 14, 16 and an output register 18. It will be appreciated that the integrated circuit 2 will typically contain a large number of such processing stages and only a few of these processing stages have been schematically illustrated. The processing stages 4, 6, 8, 10, 12 are in the form of domino logic processing stages having nodes which are precharged and then selectively discharged depending upon one or more inputs signal to those domino logic processing stages 4, 6, 8, 10, 12. The signals generated by the selective discharge of the nodes within the domino logic go on to form inputs to further stages of domino logic. This type of arrangement of domino logic is in itself known to those in this technical field and will not be described further herein.

Figure 2:
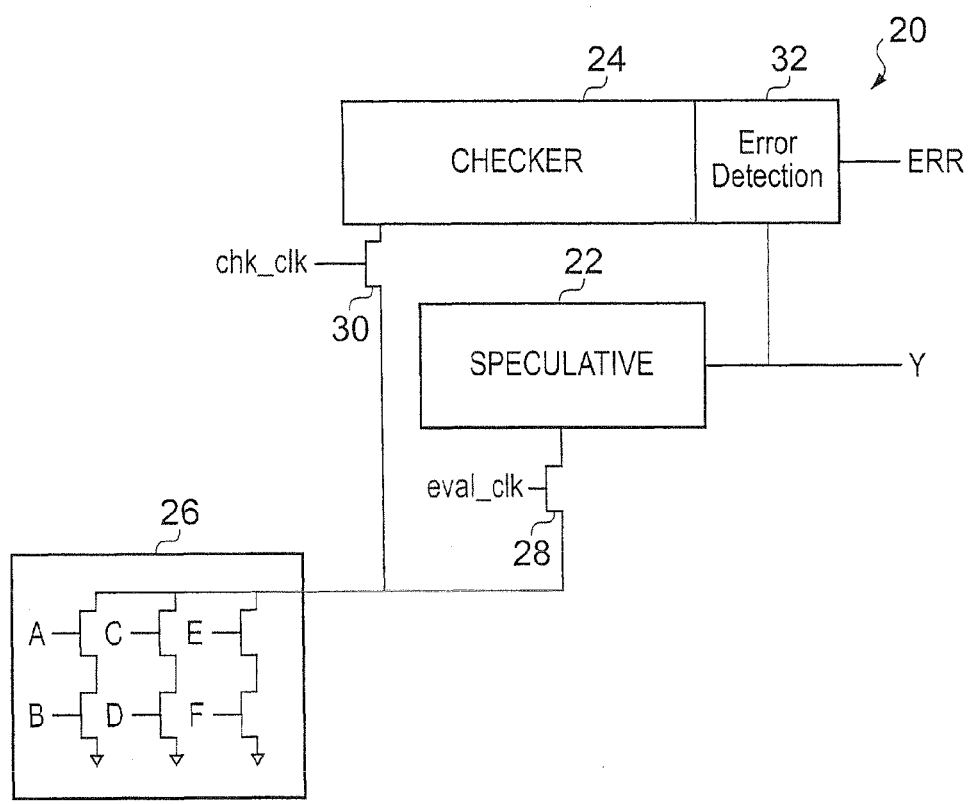
FIG. 2 schematically illustrates a processing stage utilising domino logic and having a speculative node and a checker node.

FIG. 2 schematically illustrates a processing stage 20 forming part of domino logic. The processing stage 20 includes a speculative node 22, a checker node 24 and logic circuitry 26 for selectively discharging the speculative node 22 and the checker node 24 in dependence upon the values of a plurality of input signals A, B, C, D, E, F. A speculative node evaluation gate 28 selectively couples the speculative node 22 to the logic circuitry 26 in dependence upon a speculative clock signal eval_clk. A checker node evaluate gate 30 couples the checker node 24 to the logic circuitry 26 under control of a checker clock signal chk_clk.

The output from the speculative node 22 is provided as output signal Y. This output signal Y may be supplied to a further processing stage of domino logic either in accordance with the circuit of FIG. 3 or the circuit of FIG. 9 (as will be described later). Error detection circuitry 32 serves to receive signals both from the speculative node 22 and the checker node 24 indicating whether these respective nodes are discharged or undischarged. In correct operation the behaviour of the speculative node 22 and the checker node 24 will be the same. Accordingly, if operation is correct then both the speculative node 22 and the speculative node 24 will be discharged or both the speculative node 22 and the checker node 24 will be undischarged. If only the one of the speculative node 22 and the checker node 24 is discharged or if the speculative node 22 is partially discharged (corresponding to metastability), then this indicates erroneous operation and the error detection circuitry 32 generates an error signal. This error signal can then be used to control the operational parameters of the domino logic processing stage 20 in order to try to prevent further erroneous operation.

Figure 3:
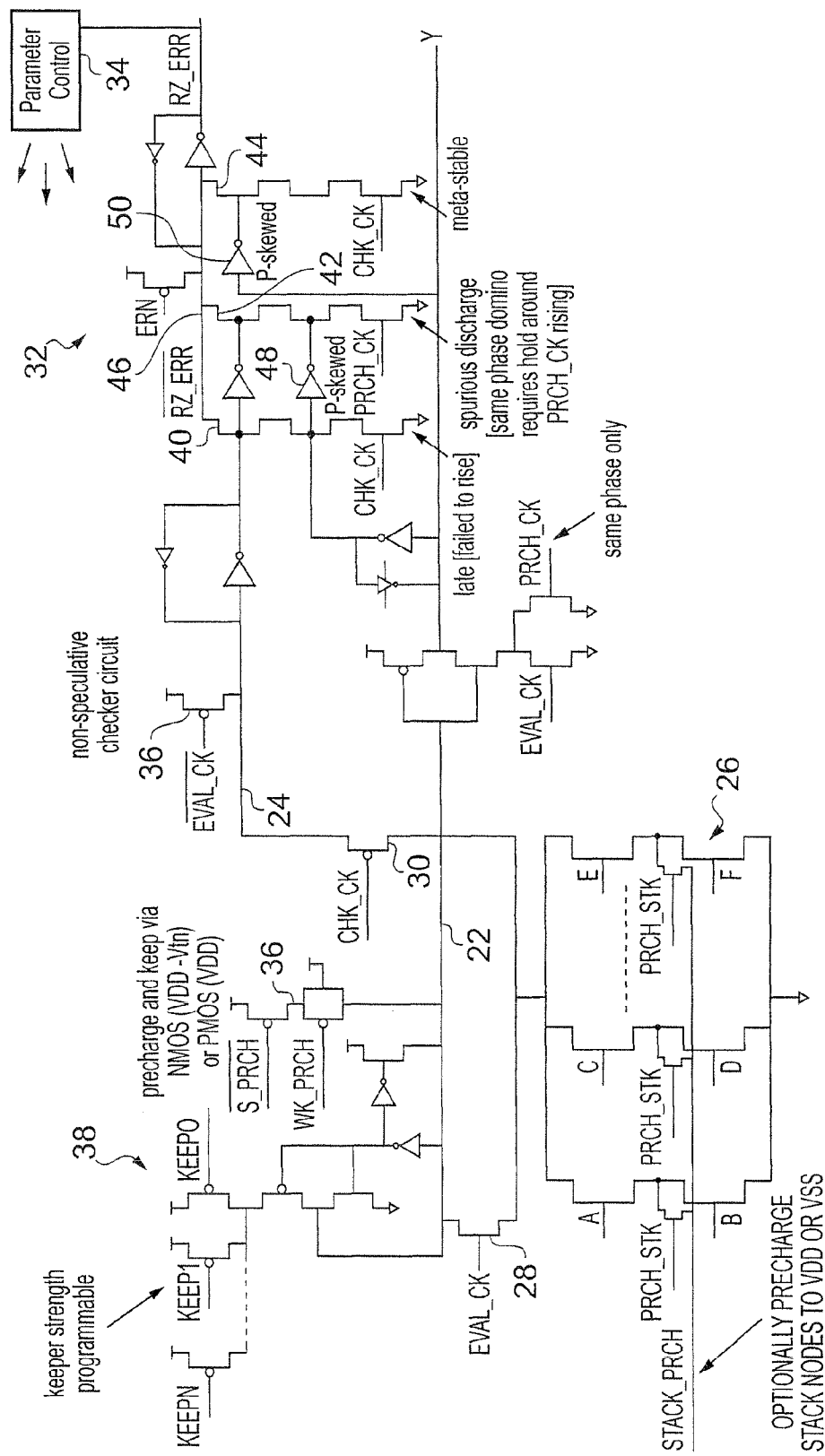
FIG. 3 is a gate level circuit diagram illustrating a processing stage incorporating domino logic and having a speculative node and a checker node.

FIG. 3 illustrates at gate level the processing stage 20 using domino logic. Logic circuitry 26 provides a discharge path to ground in dependence upon a plurality of input signals A, B, C, D, E and F. The nodes within the logic circuitry 26 may optionally be precharged to VDD or VSS if required. This optional precharging of the stack nodes within the logic circuitry 26 is an operating parameter which may be controlled in dependence upon whether or not errors are detected so as to increase the robustness of operation of the processing stage 20. The parameter control circuitry 34 is responsive to an error signal generated by the error detection circuitry 32 so as to adjust various operation parameters of the processing stage 20.

The speculative node 22 is shown in FIG. 3 as a signal line selectively coupled via speculative node evaluate gate 28 to the logic circuitry 26. The speculative node 22 is precharged via precharge circuitry 36. This precharge circuitry can precharge the speculative node 22 to a variety of different potential levels under control of a strong precharge selecting signal and a weak precharge selecting signal generated by the parameter control circuitry 34. A stronger precharge will produce more robust operation, but the domino logic will tend to operate more slowly. The checker node 24 is a signal line coupled to the logic circuitry 26 via the checker node evaluate gate 30. The precharge circuitry 36 also includes a gate which precharges the checker node 24 to VDD.

Keeper circuitry 38 comprises a plurality of weak gates acting to maintain the speculative node 22 in its precharged state. The number of these keeper gates switched into use is controlled in dependence upon the number of detected errors by the parameter control circuitry 34. The more keeper gates in use, the more strongly the speculative node 22 will keep its precharged stage and be resistant to erroneous discharge, but the more slowly it will respond to an intended discharge through the logic circuitry 26. It will be appreciated that it is desirable to only use sufficient keeper circuit strength to suppress errors and not an excess of keeper circuitry strength which would unnecessarily slow operation of the domino logic.

The error detection circuitry 32 is formed of three stacks of transistors 40, 42 and 44. Transistor stack 40 detects errors corresponding to the speculative node 22 being undischarged and the checker node 24 being discharged. This corresponds to the late arrival of one of the input signals A, B, C, D, E and F to the logic circuitry 26. If this late arrival condition occurs, then all of the transistors in the stack 40 will be switched on such that the error node 46 will be discharged and an error signal generated.

The second stack of gates 42 is responsive to the situation in which the speculative node 22 is discharged and the checker node 24 is undischarged. This corresponds to spurious discharge of the speculative node 22, such as due to noise. If such a spurious discharge error condition is present, then all of the transistors in the stack 42 will be switched on and the error note 46 will be discharged.

The final stack 44 serves to detect metastability in the state of the output signal Y. Such metastability may result from the speculative node 22 being subject to a late transition or partial discharge. The action of p-skewed inverters 48 and 50 is to drive partially discharged signals to full rail values such that, if the output signal Y is metastable, then all of the transistors within the stack 44 will be switched on and the error node 46 will again be discharged.

Figure 4:
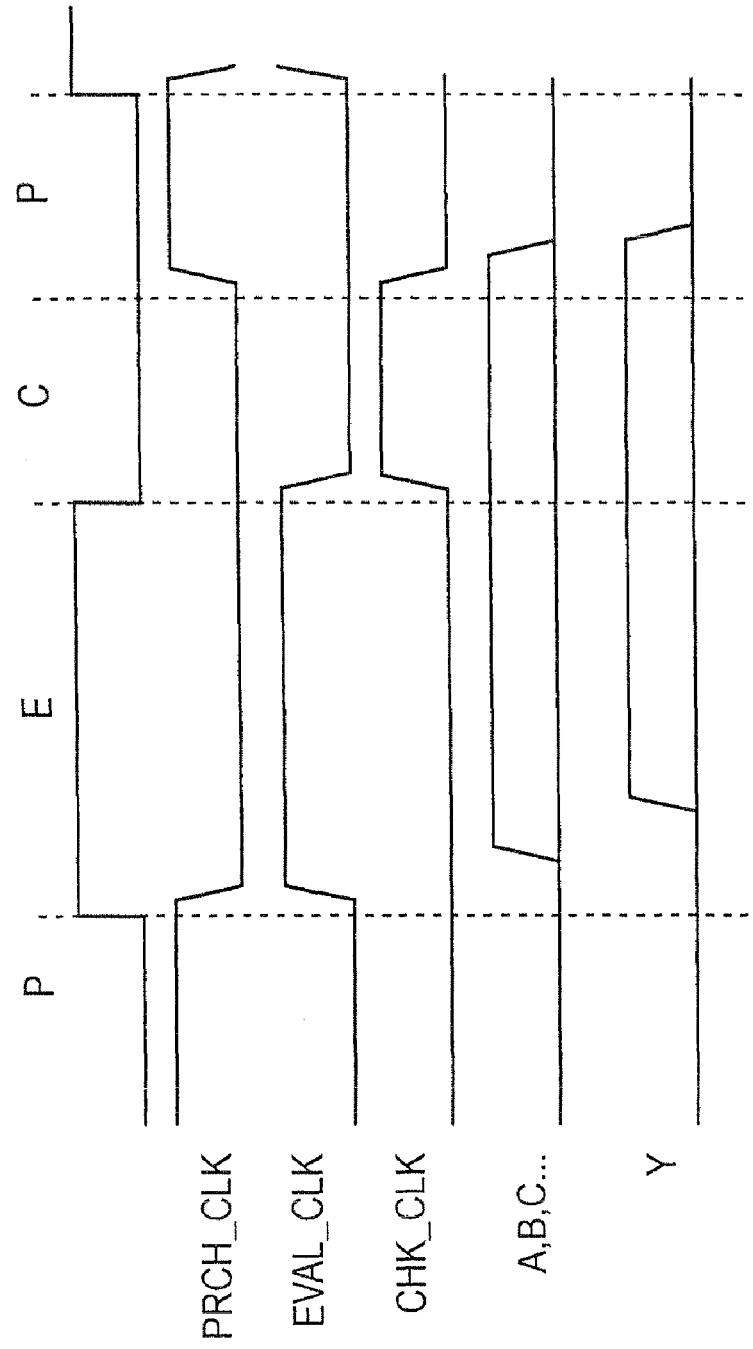
FIG. 4 is a timing diagram illustrating the relationship between a precharge period, an evaluation period and a checking period within the operation of the circuit of FIG. 3.

FIG. 4 is a timing diagram illustrating the relationship between the various clock signals, input signals and output signals used in the circuit of FIG. 3. It will be seen that the full clock cycle is split into a half cycle of the evaluate phase of the speculative node indicated by the letter E. This is followed by a quarter cycle of a checker phase in which the checker node 24 is coupled to the logic circuitry 26 indicated by the letter C. A precharge phase indicated by the letter P is formed in the final quarter cycle and during this phase the speculative node 22 and the checker node 24 are precharged back to their starting values.

The evaluate clock EVAL_CLK which controls the speculative node evaluate gate 28 acts to open this gate 28 during the evaluate half cycle E. At the end of this half cycle the checker clock CHK_CK which controls the checker node evaluate gate 30 connects the checker node 24 to the logic circuitry 26 for a subsequent quarter cycle C. The transistor stack 40 and the transistor stack 44 serve to respectively detect the late arrival of an input signal A, B, C, D, E and F or metastability in the output signal Y during the quarter phase C corresponding to the active portion of the checker clock CHK_CLK. The transistor stack 42 which detects a spurious discharge of the speculative node 22 is active during the final quarter phase P of the clock during which precharge also takes place.

As will be seen in FIG. 4, the input signals A, B, C, D, E and F during correct operation arrive early in the evaluate phase and result in an early transition in the output signal Y. This output signal Y may then be passed to further stages of domino logic operating within the same clock phase of the next clock phase. It is this propagation of signals rapidly through different domino logic processing stages which contributes to its high speed of operation when correctly formed and operated.

The evaluate clock EVAL_CLK and the checker clock CHK_CLK can be separately formed or may be part of a four-phase clocking scheme in order to divide the overall clock cycling to four periods as illustrated. The rising edge of the checker clock CHK_CLK may be triggered in some embodiments by the falling edge of the evaluate clock EVAL_CLK. It is also possible that the checker clock could be self-timed.

As will be seen in FIG. 4, both the phases C and F occur within the low phase of the clock and accordingly something beyond a simple clock is used, such as a four-phase clock scheme or the self time scheme for the phase C as discussed above. The checker phase C defines a speculation window during which the speculative result has been generated and has been passed on for further use, but has not yet been verified as correct. There is the risk that one of the input signals to the logic circuitry 26 is so late that the error checking circuit fails to identify this error. However, if these inputs are also driven by similarly protected domino circuitry, then this will also be subject to its own checking of its output signals. Thus, if stage N is subject to an overshoot due to a late signal from stage N−1, then this should be caught by the error checking logic for stage N−1.

A significant constraint on the length of the checker phase C is the worst case discharge time given that all of the inputs to the logic circuitry 26 should be stable. However, the worst case discharge time for the checking node 24 and the speculative precharged time are both likely to be less than a quarter cycle in duration and so there is sufficient time during the half cycle allocated to these phases of operation. Constraints on the inputs to the processing stage are principally controlled by the checker phase C. Inputs which resolve low must be set up before the checker phase C and inputs which resolve high must arrive in enough time for them to be evaluated. For signals arising from logic within the same phase, a hold constraint relating to the checker clock CHK-_CLK falling applies to inputs which resolve high as the following precharge stage will not cause low inputs to transition high.

Figure 5:
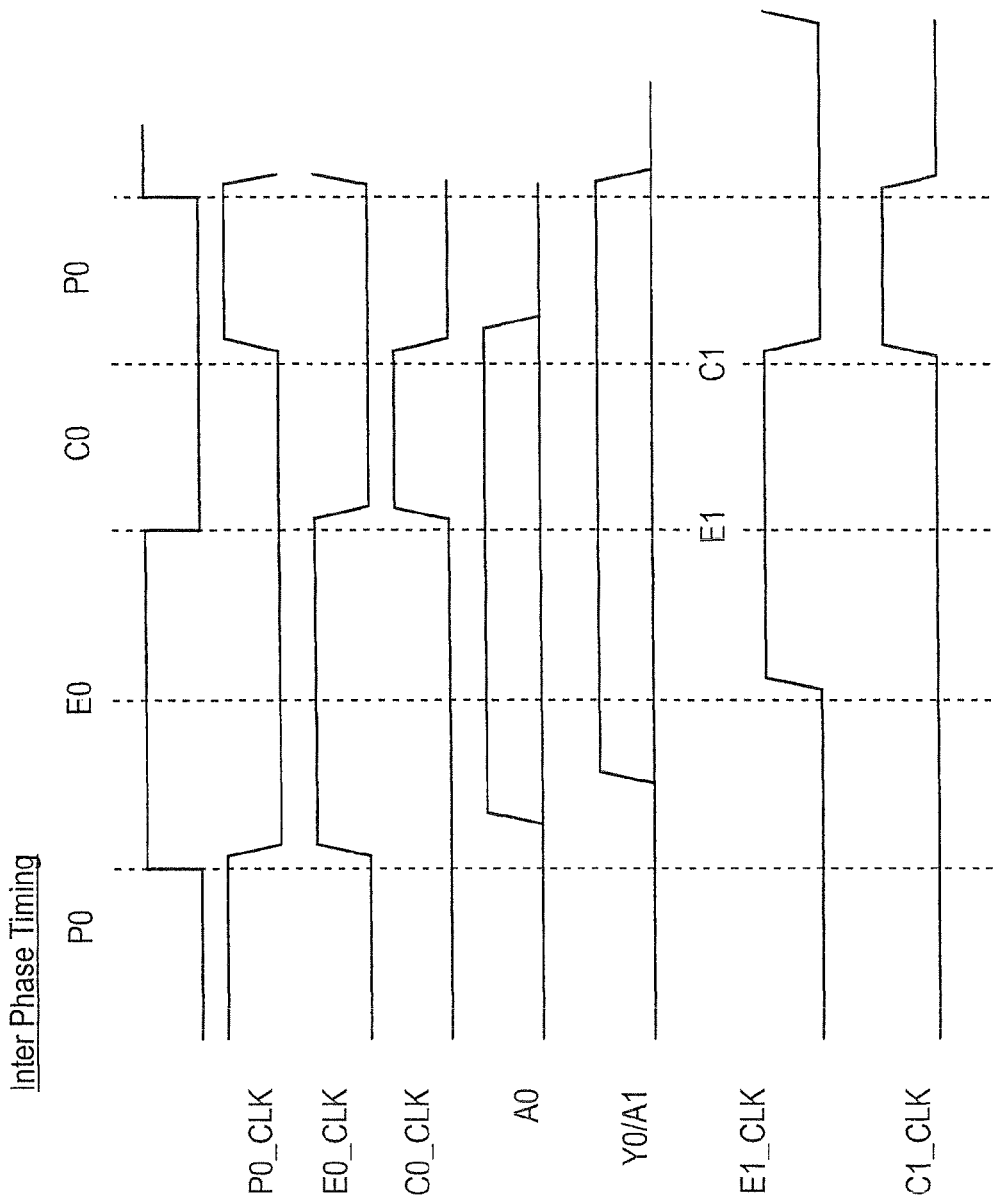
FIG. 5 is a timing diagram illustrating the relationship between precharge period, an evaluation period and a checking period for processing stages operating using different phases of a clock signal.

FIG. 5 illustrates the relationship between the individual evaluate and check clock signals of processing stages operating in different clock phases when signals are passed between those processing stages. The consumer evaluate phase is offset from the producer phase by a quarter cycle, and consequently the output of the producer phase Y0 which forms the input to the consumer phase A1 must be held stable during the precharge phase of the producer stage due to the overlap with the checker phase of the consumer phase.

Figure 6:
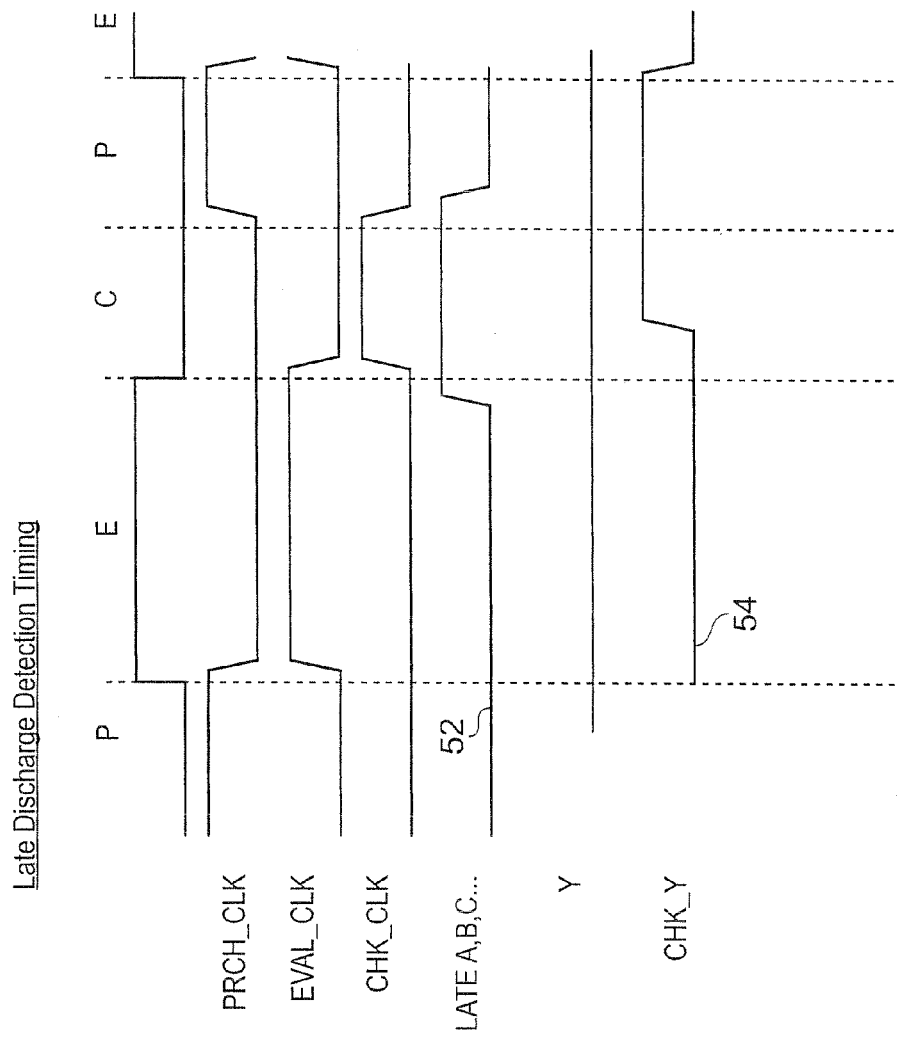
FIG. 6 is a timing diagram illustrating operation of the circuit of FIG. 3 during a late discharge.

FIG. 6 illustrates the operation of a processing stage in detecting an error due to a late discharge, i.e. one of the input signals A, B, C, D, E and F to the logic circuitry 26 does not arrive in sufficient time for the speculative node 22 to be properly discharged. As illustrated in FIG. 6, the input signals 52 arrive late and accordingly do not discharge the speculative node 22 so that the output signal Y (which has passed through an inverter) does not transition high. The late arriving input signals 52 serve to discharge the checker node 24 and accordingly a transition occurs on the checker node signal value 54. The difference between the values of the output signal Y and the checker node signal 54 is detected by the transistor stack 40 so that the error node 46 is discharged and an error is detected.

Figure 7:
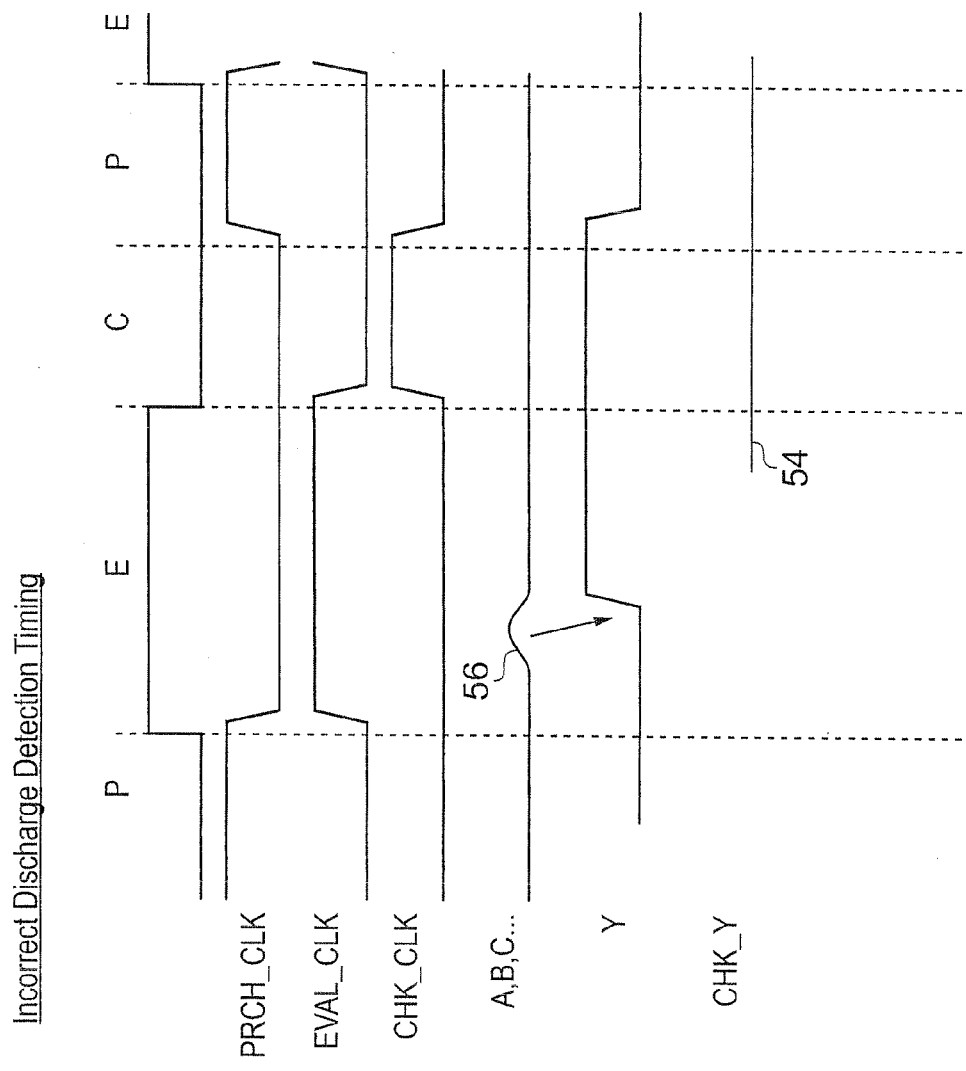
FIG. 7 is a timing diagram illustrating operation of the circuit of FIG. 3 during an incorrect discharge.

FIG. 7 illustrates detecting an error due to an incorrect discharge of the speculative node 22. As illustrated in FIG. 7, noise 56 in the input signals to the logic circuitry 26 incorrectly discharges the speculative node 22 resulting in an incorrect transition in the output signal Y. The checker node signal 54 will not transition. Accordingly, this difference in the discharge between the speculative node 22 and the checker node 24 will be detected by the transistor stack 42 which will discharge the error node 46 and generate an error signal.

Figure 8:
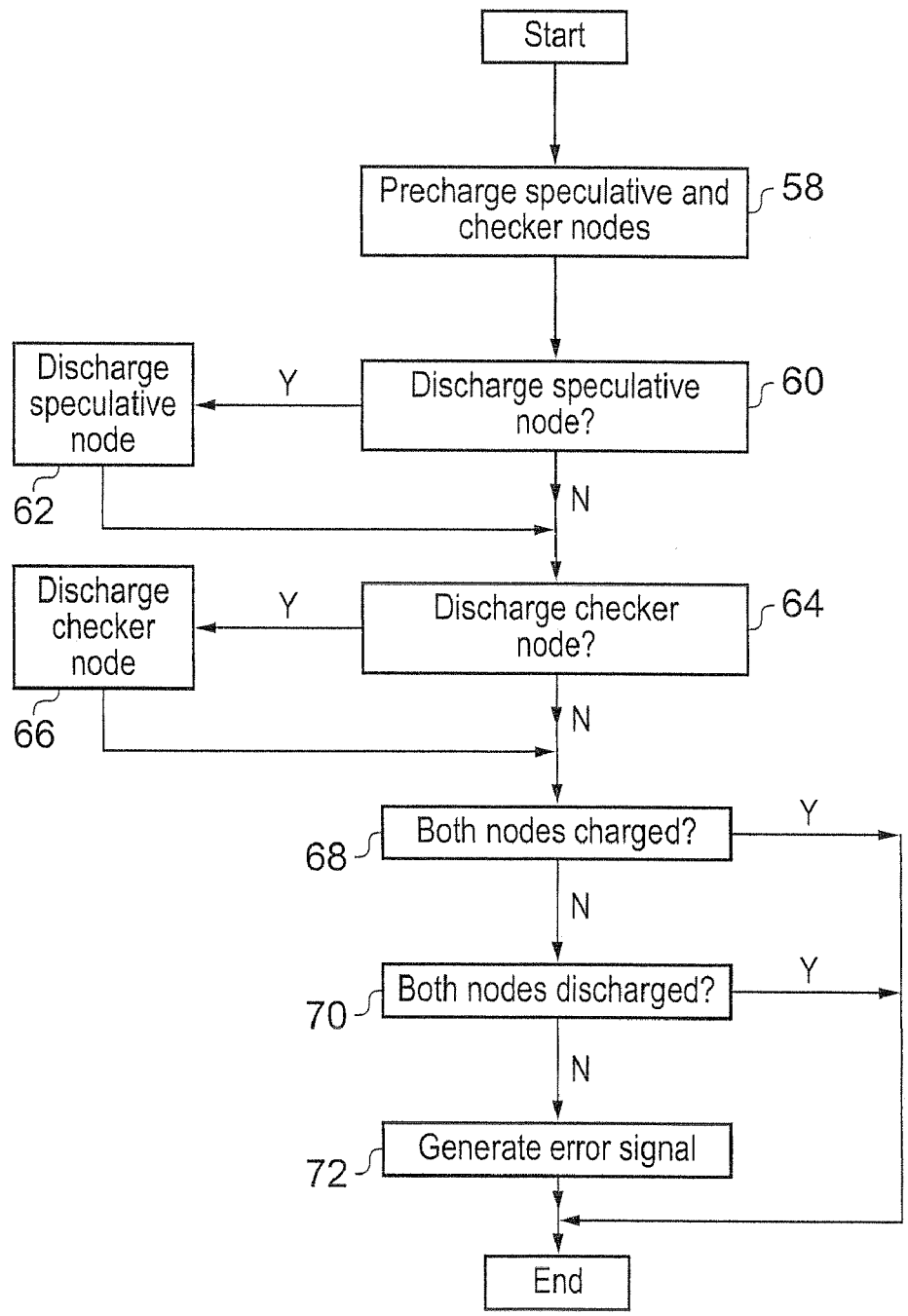
FIG. 8 is a flow diagram schematically illustrating the operation of the circuit of FIG. 3.

FIG. 8 is a flow diagram schematically illustrating the operation of the circuit of FIG. 3. It will be appreciated that such a flow diagram necessarily shows a sequential process whereas those in this technical field will appreciate that in a hardware implementation many of the processing steps can be performed in parallel, or may be performed in a different order.

At step 58 the speculative node 22 and the checker node 24 are precharged. Step 60 corresponds to the action of the logic circuitry 26 in discharging the speculative node 22 via step 62, if this is selected by the input signals A, B, C, D, E and F. Subsequently, steps 64 and 66 serve to discharge the checker node 24, if this is selected by the input signals A, B, C, D, E and F, through the logic circuitry 26 during the checker phase C.

Step 68 determines whether both nodes are undischarged. If both nodes are undischarged, then this correspondence to correct operation and processing terminates. If both nodes are not charged, then step 70 determines whether both nodes are discharged. If both nodes are discharged, then this corresponds to correct operation and processing is terminated. If the tests at steps 68 and 70 serve to indicate that the nodes are not both fully charged or both fully discharged, then this corresponds to an error and an error signal is generated at step 72.

Figure 9:
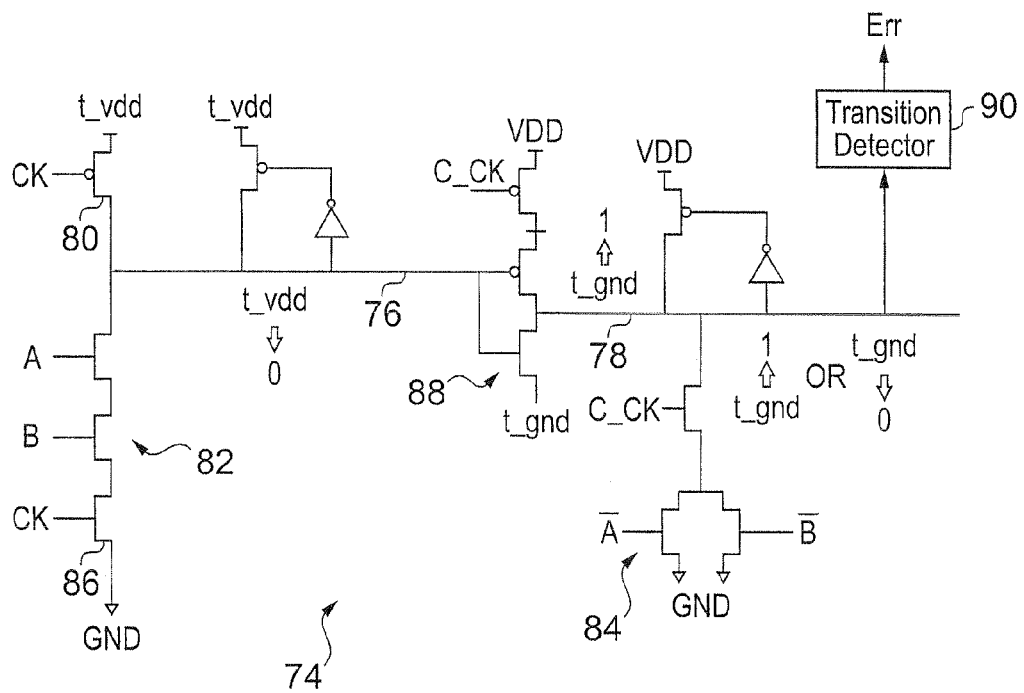
FIG. 9 is a gate level circuit diagram illustrating another example embodiment of domino logic incorporating error detecting circuitry.

FIG. 9 illustrates at a gate level an alternative circuit for a processing stage 74. This processing stage 74 may be used in combination with the processing stage of FIG. 3 or on its own. The processing stage 74 includes a speculative node 76, an output node 78, precharge circuitry 80, logic circuitry 82 and complementary logic circuitry 84. The complementary logic circuitry 84 is supplied with input signals which are the logical complements of the input signals which are supplied to the logic circuitry 82. The arrangement of the complementary logic circuitry 84 is such that for input signals A and B if the logic circuitry 82 provides a discharge path for the speculative node 76, then the complementary logic circuitry 84 will not provide a discharge path for the output node 78. Conversely, if the logic circuitry 82 does not provide a discharge path for the speculative node 76, then the complementary logic circuitry 84 will provide a discharge path for the output node 78.

Figure 10:
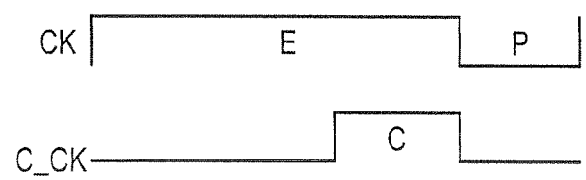
FIG. 10 is a timing diagram schematically illustrating the operation of a main clock and a checking clock in the operation of the circuit of FIG. 9.

Evaluation control circuitry in the form of gate 86 serves to couple the speculative nodes 76 to a discharge path via the logic circuitry 82 during an evaluate phase E of a clock signal CK. The precharged circuitry 80 is inactive during this evaluation phase. With reference to FIG. 10 illustrating timings of the control signals for the circuit of FIG. 9, an inverter 88 serves to pass the signal from the speculative node 76 to the output node 78 when clock signal C_CK is low, i.e. during the first part of E, when C is not active and during P (to ensure output node 78 is low before the next E). If the speculative node 76 has discharged, then the inverter 88 will result in the output node 78 being charged. If the discharge of the speculative node 76 was correct and was the result of a proper discharge through the logic circuitry 82, then the complementary logic circuitry 84 will not provide a discharge path during the checking phase and accordingly the output node 76 will remain high. However, if the discharge of the speculative node 76 was unintended, e.g. due to noise, then the complementary logic circuitry 84 will provide a discharge path during the checking phase C and the output node 78 will transition from high to low. The transition detector 90 forms error detection circuitry which is responsive to detection of such a transition in the output node being discharged through the complementary logic circuitry 84 to generate an error signal Err.

If an error is detected, then the operating parameters of the processing stage 74 may be adjusted. This adjustment may take the form of adjusting the VDD or ground levels used to drive the speculative node 76 and the inverter 88 respectively so as to increase the noise immunity of the inverter 88 (slowing down the inverter 88 after an error rather than speeding it up). These are illustrated as the levels t_vdd and t_gnd in FIG. 9. Increasing the VDD supplied to the speculative node makes operation more robust but slower. Similarly, decreasing the ground level to the inverter 88 makes operation more robust but slower.

FIG. 10 illustrates the timing relationship between the signals which control the operation of the logic circuitry 80 and those which control the operation of the inverter 88 and the complementary logic circuitry 84. Operation falls into an evaluate phase E, a checking phase C and a precharge phase P.

Figure 11:
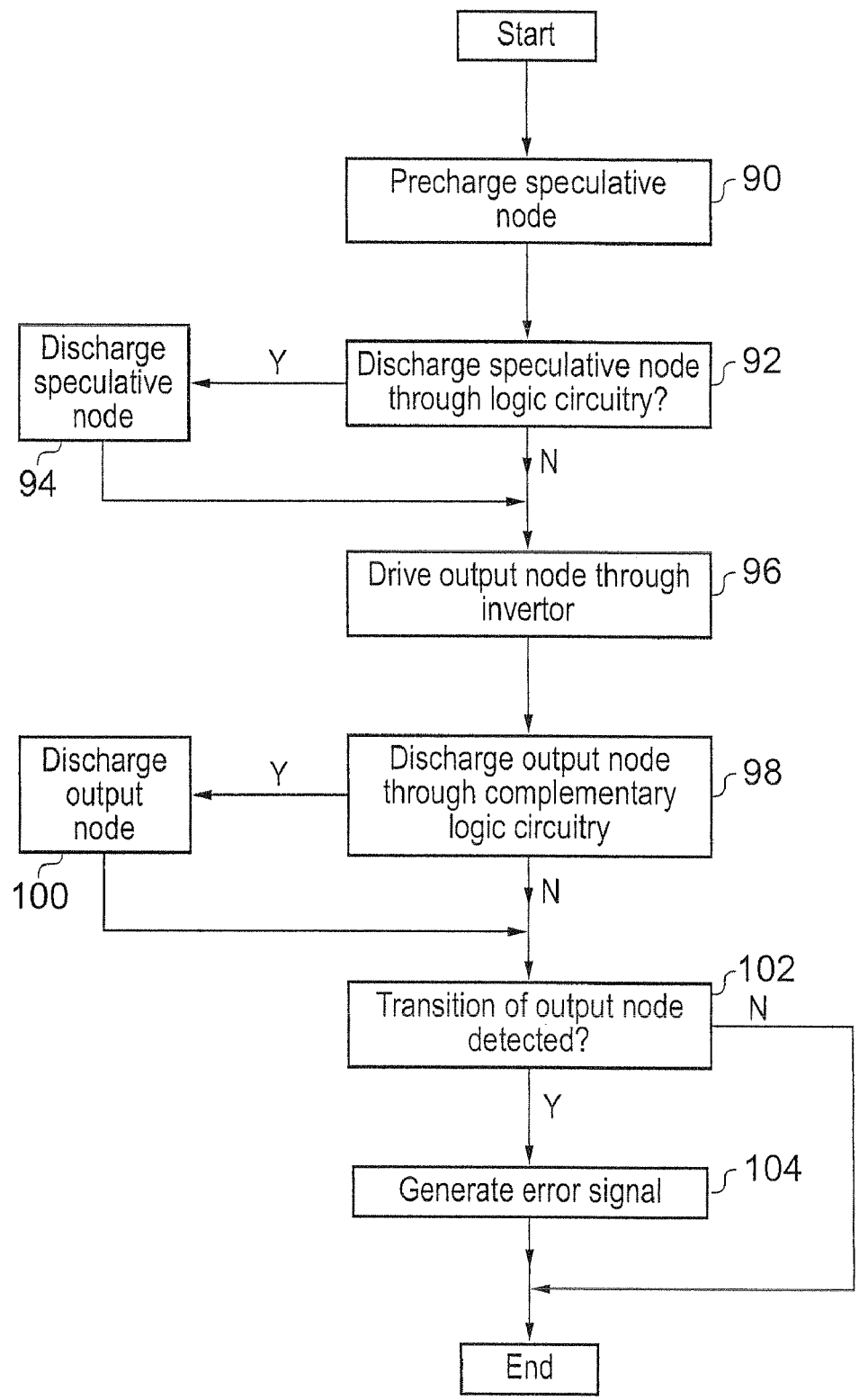
FIG. 11 is a flow diagram schematically illustrating the operation of the circuit of FIG. 9.

FIG. 11 is a flow diagram schematically illustrating the operation of the circuit of FIG. 9. It will be appreciated by those in this technical field that the processing steps illustrated in FIG. 11 may take place in a different order or with some of the steps taking place in parallel.

At step 90 the speculative node 76 is precharged high resulting in the output node 78 being low. At steps 92 and 94 the speculative node 76 is discharged in dependence upon the input signal values A and B. At step 96 the speculative node signal value 76 is driven through the inverter 88 to the output node 78. At steps 98 and 100 the output node 78 is selectively discharged based upon the complement input signals and supplied to the complementary logic circuitry 84.

At step 102 the transition detector 90 detects whether or not there is a transition in the output signal level of the output node 78, i.e. the output node 78 has discharged through the complementary logic circuitry 84. If such a transition is detected, then step 104 generates an error signal.

Although illustrative embodiments have been described in detail herein with reference to the accompanying drawings, it is to be understood that the claims are not limited to those embodiments, and that various changes and modifications can be effected therein by one skilled in the art without departing from the scope and spirit of the appended claims.

We claim:

1. An integrated circuit having at least one processing stage comprising:
   a speculative node;
   an output node;
   precharge circuitry coupled to said speculative node to precharge said speculative node;
   logic circuitry responsive to one or more input signals to provide a first discharge path in dependence upon values of said one or more input signals;
   complementary logic circuitry responsive to one or more complement input signals, said one or more complement input signals being complements of said one or more input signals, to provide a second discharge path in dependence upon said one or more complement input signals, such that combinations of said one or more input signals that provide said first discharge path do not provide said second discharge path and combinations of said one or more input signals that do not provide said first discharge path do provide said second discharge path;
   evaluation control circuitry responsive to at least one evaluation control signal to couple said speculative node to said logic circuitry to be discharged through said first discharge path in dependence upon said one or more input signals;

an inverting circuit coupled to said speculative node and configured to charge said output node if said speculative node is discharged; wherein subsequent to coupling of said speculative node to said logic circuit, said evaluation circuit couples said output node to said complementary logic circuitry to be discharged through said second discharge path in dependence upon said one or more complementary input signals; and error detection circuitry coupled to said output node to detect an error when said output node is discharged through said complementary logic circuitry.

2. An integrated circuit as claimed in claim 1, comprising a plurality of said processing stages providing a domino logic circuit.

3. An integrated circuit as claimed in claim 2, wherein a signal value of said output node of a first processing stage of said domino logic circuit is supplied as an input signal to logic circuitry of a second processing stage of said domino logic.

4. An integrated circuit as claimed in claim 1, wherein said error detection circuitry comprises a transition detector.

5. An integrated circuit as claimed in claim 1, wherein said precharge circuitry is responsive to detection of an error by said error detection circuitry to increase in magnitude said precharge of said speculative node.

6. An integrated circuit as claimed in claim 1, wherein detection of an error by said error detection circuitry triggers a change in one or more power supply voltages to said inverter so as to increase a speed of operation of said inverter.

7. An integrated circuit as claimed in claim 1, comprising a further processing stage comprising:
a further speculative node;
a checker node;
further precharge circuitry coupled to said further speculative node and to said checker node to precharge said further speculative node and to precharge said checker node;
further logic circuitry responsive to one or more further input signals to provide a further discharge path in dependence upon values of said one or more further input signals;
further evaluation control circuitry responsive to at least one further evaluation control signal to couple said further speculative node to said further logic circuitry to be discharged through said further discharge path in dependence upon said one or more further input signals and subsequently to couple said checker node to said further logic circuitry to be discharged through said further discharge path in dependence upon said one or more further input signals; and
further error detection circuitry coupled to said further speculative node and to said checker node to detect an error when any one of:
(i) said speculative nodes is discharged and said checking node is undischarged;
(ii) said speculative node is undischarged and said checking node is discharge; and
(iii) said speculative node is partially discharged.

8. An integrated circuit having at least one processing stage comprising:
speculative node means;
output node means;
precharge means coupled to said speculative node for precharging said speculative node means;
logic means responsive to one or more input signals for providing a first discharge path in dependence upon values of said one or more input signals;
complementary logic means responsive to one or more complement input signals that are complements of said one or more input signals for providing a second discharge path in dependence upon said one or more complement input signals, such that combinations of said one or more input signal that provide said first discharge path do not provide said second discharge path and combinations of said one or more input signals that do not provide said first discharge path do provide said second discharge path;
evaluation control means responsive to at least one evaluation control signal for coupling said speculative node means to said logic means to be discharged through said discharge path in dependence upon said one or more input signals;
an inverting circuit coupled to said speculative node means and configured to charge said output node if said speculative node means is discharged; wherein
subsequent to coupling of said speculative node means to said logic means, said evaluation means couples said output node means to said complementary logic means to be discharged through said discharge path in dependence upon said one or more input signals; and
error detection means coupled to said output node to detect an error when said output node means is discharged through said complementary logic means.

9. A method of operating an integrated circuit, said method comprising comprising the steps of:
precharging a speculative node;
providing a first discharge path in dependence upon values of one or more input signals;
providing a second discharge path in dependence upon one or more complement input signals, said one or more complement input signals being complements of said one or more input signals, such that combinations of said one or more input signals that provide said first discharge path do not provide said second discharge path and combinations of said one or more input signals that do not provide said first discharge path do provide said second discharge path;
in response to at least one evaluation control signal, coupling said speculative node to be discharged to said first discharge path in dependence upon said one or more input signals;
charging an output node if said speculative node is discharged;
subsequent to said coupling of said speculative node, coupling said output node to be discharged to said second discharge path in dependence upon said one or more complementary input signals; and
detecting an error when said output node is discharged through said second discharge path.

* * * * *